United States Patent
Taniguchi et al.

(10) Patent No.: US 7,033,675 B2
(45) Date of Patent: *Apr. 25, 2006

(54) POLYARLKETONE RESIN FILM AND A LAMINATE THEREOF WITH METAL

(75) Inventors: Kouichirou Taniguchi, Nagahama (JP); Singetsu Yamada, Nagahama (JP)

(73) Assignee: Mitsubishi Plastics, Inc., Tokyo (JP)

( * ) Notice: Subject to any disclaimer, the term of this patent is extended or adjusted under 35 U.S.C. 154(b) by 166 days.

This patent is subject to a terminal disclaimer.

(21) Appl. No.: 10/470,141

(22) PCT Filed: Jan. 21, 2002

(86) PCT No.: PCT/JP02/00392

§ 371 (c)(1),
(2), (4) Date: Jul. 22, 2003

(87) PCT Pub. No.: WO02/057343

PCT Pub. Date: Jul. 25, 2002

(65) Prior Publication Data

US 2004/0096678 A1    May 20, 2004

(30) Foreign Application Priority Data

Jan. 22, 2001  (JP) .............................. 2001-013139

(51) Int. Cl.
*B32B 15/08*  (2006.01)
*C08L 71/00*  (2006.01)

(52) U.S. Cl. .................. 428/458; 428/457; 428/473.5; 525/436

(58) Field of Classification Search .............. 428/457, 428/458, 473.5; 525/436
See application file for complete search history.

(56) References Cited

U.S. PATENT DOCUMENTS 6,228,467 B1     5/2001  Taniguchi et al. .......... 428/209
6,824,884 B1 *  11/2004  Taniguchi et al. ....... 428/473.5

FOREIGN PATENT DOCUMENTS

| JP | 6-2149436 | 7/1987 |
| JP | 3-020354 | 1/1991 |
| JP | WO 99/37704 | 7/1999 |
| JP | 2000200950 | 7/2000 |
| JP | 2002-105221 | 4/2002 |
| JP | 2003064202 A * | 3/2003 |
| JP | 2004025484 A * | 1/2004 |
| WO | 02/14404 | 2/2002 |

OTHER PUBLICATIONS

Hudson, Steven D., Davis, Don D., & Lovinger, Andrew J. (1992). Semicrystalline morphology of poly(aryl ether ether ketone)/poly(ether imide) blends Macromolecules 23(6), 1759-1765.

* cited by examiner

Primary Examiner—Monique R. Jackson
(74) Attorney, Agent, or Firm—Pitney Hardin LLP

(57) ABSTRACT

A film of a resin composition comprising total 100 parts by weight of a crystalline polyarylketone resin (A) and a noncrystalline polyetherimide resin (B), and 5 to 50 parts by weight of a filler, said film satisfies the following relation $$Tc(A) < Tc(A+B) \leq Tg(B) + 20$$

wherein, Tc (A) is a peak temperature of crystallization of the crystalline polyarylketone resin (A), Tc (A+B) is the peak temperature of crystallization of the film, and Tg (B) is a glass transition temperature of the noncrystalline polyetherimide resin (B), each temperature value being measured bu differential scanning calorimetry at a heating rate of 10 degrees C./minute. The film and a metal laminate thereof are suitable for electronics parts.

13 Claims, No Drawings

POLYARLKETONE RESIN FILM AND A LAMINATE THEREOF WITH METAL

FIELD OF THE INVENTION

This invention relates to a polyarylketone resin film having an improved edge tearing resistance. The film is suitable for electronic parts such as printed wiring boards. This invention relates also to a metal laminate comprising a metal body laminated on at least one side of the film.

DESCRIPTION OF THE PRIOR ART

A crystalline polyarylketone resin, typically polyetheretherketone, is excellent in heat resistance, flame retardant property, hydrolysis resistance, and chemical resistance, and, therefore, widely used mainly for aircraft parts, electric parts or electronic parts. However, raw materials for the polyarylketone resin are very expensive. Further, a glass transition temperature of the resin is so low as about 140 degrees C. to 170 degrees C. For this reason, various attempts have been made to further improve heat resistance of the resin, among which a blend of the resin with a noncrystalline polyetherimide resin has attracted attentions. For instance, Japanese Patent Application Laid-open No. 59-187054/1984 and National Publication of PCT Application No. 61-500023/1986 disclose compositions of the crystalline polyarylketone resin with the noncrystalline polyetherimide resin; Japanese Patent Application Laid-open No. 59-115353/1984 describes that those compositions are useful for a substrate of a circuit board; Japanese Patent Application Laid-open No. 2000-38464 and Japanese Patent Application Laid-open No. 2000-200950 by the present inventors disclose a printed wiring board comprising the aforesaid composition and a production method thereof.

A flexible printed wiring board made of a film of the composition of the crystalline polyarylketone resin and the noncrystalline polyetherimide resin, which composition usually comprises an inorganic filler to improve dimensional stability, is good in dimensional stability and heat resistance. However, its mechanical strength, especially edge tearing resistance, is not satisfactory, which results in poor folding resistance or bending resistance. Therefore, reliable electrical connection is not secured, and the board has only limited applications. Also, improvement is required in a handling property in a step of processing the flexible printed wiring boards.

Thus, an object of the present invention is to provide a polyarylketone resin film suitable as an electronic part, particularly having an improved edge tearing resistance and a metal laminate comprising the film laminated on a metal body.

SUMMARY OF THE INVENTION

The present inventors have found that the above problems can be solved by using, as a major component, a resin composition comprising a crystalline polyarylketone resin having a specific crystallization property and a noncrystalline polyetherimide resin.

Thus, the present invention is a film of a resin composition comprising total 100 parts by weight of a crystalline polyarylketone resin (A) and a noncrystalline polyetherimide resin (B), and 5 to 50 parts by weight of a filler, said film having a peak temperature of crystallization, Tc (A+B) measured by differential scanning calorimetry at a heating rate of 10 degrees C./minute, which satisfies the following relation $$Tc(A) < Tc(A+B) \leq Tg(B) - 14.7$$

wherein, Tc (A) is a peak temperature of crystallization of the crystalline polyarylketone resin (A), Tc (A+B) is the peak temperature of crystallization of the film, and Tg (B) is a glass transition temperature of the noncrystalline polyetherimide resin (B), each temperature value being measured by differential scanning calorimetry at a heating rate of 10 degrees C./minute.

The preferred embodiments of the present invention are as follows.

The film according to the film described above, wherein the crystalline polyarylketone resin (A) is composed mainly of a polyetheretherketone resin having structural repeating units of the formula (1) and the noncrystalline polyetherimide resin (B) is composed mainly of a polyetherimide resin having structural repeating units of the formula (2).

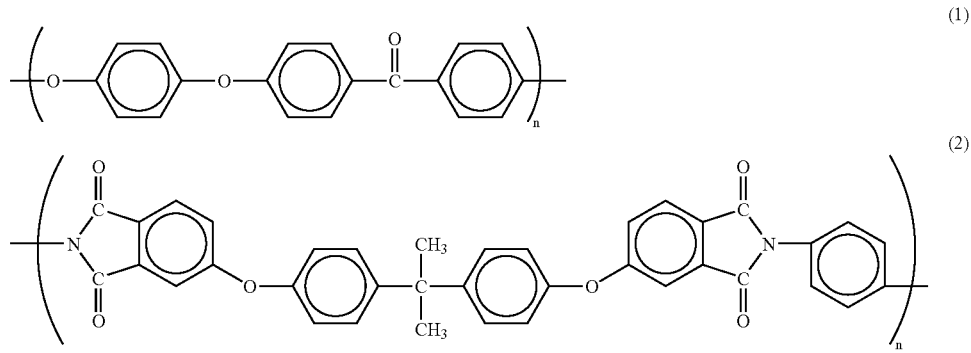

The film according to any one of the films described above, wherein the filler is an inorganic filler in an amount of from 10 to 40 parts by weight per total 100 parts by weight of the crystalline polyarylketone resin (A) and the noncrystalline polyetherimide resin (B).

The film according to any one of the films described above, wherein the melting peak temperature of crystals of a mixed resin consisting of the crystalline polyarylketone resin (A) and the noncrystalline polyetherimide resin (B) is 260 degrees C. or higher, and a mixing ratio of (A)/(B) is in a range of from 70/30 to 30/70.

Another aspect of the present invention is a crystallized film from the film according to any one of described above. Preferred embodiments of the crystallized film are as follows.

The film according to the film described above, wherein the crystallization is performed in an out-line crystallization method.

The film according to any one of the films described above, wherein the film has a coefficient of linear expansion of $30 \times 10^{-6}$/degrees C. or smaller and an edge tearing resistance of at least 45 N in both longitudinal and transverse directions.

Still another aspect of the present invention is a metal laminate comprising a metal body laminated on at least one side of the film according to any film described above without an adhesive layer therebetween.

Preferably, the metal comprises copper, aluminum, or stainless steal, and the metal body is laminated to the film by heat bonding.

The present invention relates also to a crystallized film comprising total 100 parts by weight of a crystalline polyarylketone resin (A) and a noncrystalline polyetherimide resin (B), and 5 to 50 parts by weight of a filler, said film having a coefficient of linear expansion of $30 \times 10^{-6}$/degrees C. or smaller and an edge tearing resistance according to JIS C2151 of at least 50 MPa in both longitudinal and transversal directions.

A metal laminate comprising a metal body laminated on the film described above is also provided. Preferably, the metal comprises copper, aluminum, or stainless steal

DESCRIPTION OF THE PREFERRED EMBODIMENTS

The present film is prepared from a composition comprising 100 parts by weight of a mixture of a crystalline polyarylketone resin (A), a noncrystalline polyetherimide resin (B), and 5 to 50 parts by weight of a filler. The term "film" as used herein also implies a sheet having a relatively large thickness of about 500 μm or more.

The crystalline polyarylketone resin used in the present invention is a thermoplastic resin having structural units bonds. Typical examples of the polyarylketone resin are polyether ketone, polyetheretherketone, and polyetherketoneketone, among which the polyetheretherketone of the following repeating unit (1) is preferably used in the present invention. The polyetheretherketone having the repeating unit is available under trade names, "PEEK151G", "PEEK381G", and "PEEK450G", from VICTREX Co. The crystalline polyarylketone resin can be used alone or in combination of two or more of them.

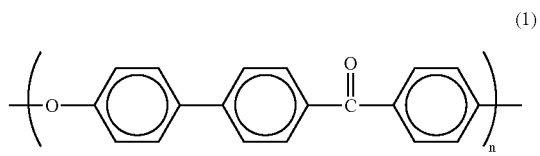

(1)

The noncrystalline polyetherimide resin is a thermoplastic resin having structural units which comprises aromatic nucleus bonds, ether bonds, and imide bonds. Examples of the noncrystalline polyetherimide resin are those having the following repeating unit (2) or (3), which are available under a trade name, "Ultem CRS5001" and "Ultem1000", respectively, from General Electric Co. In the present invention, any noncrystalline polyetherimide resin may be used, as far as a mixture with the crystalline polyarylketone resin below satisfies the crystallization property described later in the specification. In the present invention, the polyetherimide resin having the following repeating unit (2) is preferably used. The reason for this may be that a mixture of the polyetheretherketone of the formula(1) and the polyetherimide resin of the formula (2) is different in electronic interaction between molecules from that in a mixture of the resin(1) and the polyetherimide resin of the formula (3), and also has different miscibility and, therefore, develops a unique high-order structure, which contributes to the improvement in edge tearing resistance.

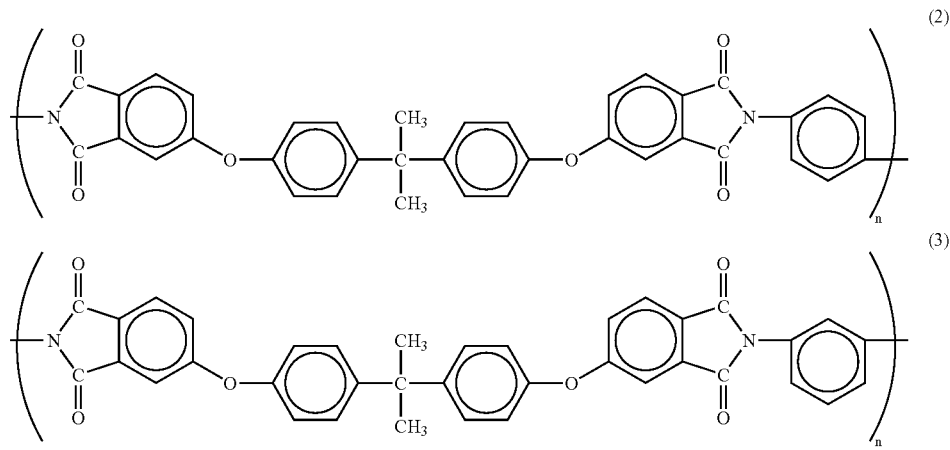

The noncrystalline polyetherimide resin may be produced in any known method. Usually, the noncrystalline polyetherimide resin of the aforesaid formula (2) is produced by a known method as a polycondensation product of 4,4'-[isopropylidene bis(p-phenyleneoxy)diphthalic dianhydride with p-phenylenediamine; and the noncrystalline polyetherimide resin of the formula (3), as a polycondensation product of 4,4'-[isopropylidene bis(p-phenyleneoxy)diphthalic dianhydride with m-phenylenediamine. The aforesaid noncrystalline polyetherimide resin(2) may include other copolymerizable monomeric units in an amount which does not adversely affect the present invention. The noncrystalline polyetherimide resin can be used alone or in combination of two or more of them.

When the present film is used for a base material of an electronic board such as a printed wiring board, it is preferred that a melting peak temperature of crystals of a mixture of the crystalline polyarylketone resin (A) and the noncrystalline polyetherimide resin (B) is 260 degrees C. or higher, and a weight ratio of the polyarylketone resin (A) to the noncrystalline polyetherimide resin (B) is in the range of from A/B=70/30 to 30/70.

If the amount of the crystalline polyarylketone resin is more than 70 wt % or the amount of the noncrystalline polyetherimide resin is less than 30 wt %, an increase in glass transition temperature of the whole mixed resin is less, so that heat resistance tends to be undesirably low. In addition, a volume shrinkage (dimensional change) associated with the crystallization is larger, so that reliability of a circuit board tends to be undesirably poor.

If the amount of the crystalline polyarylketone resin is less than 30 wt % or the amount of the noncrystalline polyetherimide resin is more than 70 wt %, a degree and rate of crystallization of the resin mixture are so small that soldering heat resistance is undesirably low even when peak melting temperature of crystal is 260 degrees C. or higher.

Therefore, in the present invention, the composition comprising 65 to 35 wt % of the aforesaid crystalline polyarylketone resin and 35 to 65 wt % of the noncrystalline polyetherimide resin is preferably used as a base material of electronic boards.

If a filler is incorporated in an amount of more than 50 parts by weight per 100 parts by weight of the aforesaid resin composition, flexibility and edge tearing resistance of a film are undesirably lower. If the filler is incorporated in an amount of less than 5 parts by weight, improvement in dimension stability through decrease in a coefficient of linear expansion is undesirably smaller. Therefore, the filler is incorporated preferably in an amount of from 10 to 40 parts by weight per 100 parts by weight of the aforesaid resin composition. For an application where balance between the dimension stability and the flexibility or the edge tearing resistance is important, the amount of the filler is adjusted preferably in a range of from 20 to 35 parts by weight.

Any known filler can be used, for example, inorganic filler such as talc, mica, clay, glass, aluminum, silica, aluminum nitride, and silicon nitride, and fiber such as glass fiber and aramid fiber. These may be used alone or in combination of two or more of them. The filler may be surface treated with coupling agents such as titanate, fatty acids, resin acids, or various kinds of surfactants. Particularly when the present film is used for a printed wiring board, inorganic filler having an average particle size of from 1 to 20 μm and an average aspect ratio, i.e., a ratio of a particle diameter to thickness, of about 20 to about 30 or larger, particularly 50 or larger, is preferably used.

The present film is characterized in that it comprises the aforesaid resin composition and has a peak temperature of the crystallization, Tc (A+B), measured by differential scanning calorimetry at a heating rate of 10 degrees C./minute satisfies the following relation (I).

$$Tc(A) < Tc(A+B) \leq Tg(B) + 20 \tag{I}$$

In the relation (I), each value in degrees C. is determined by differential scanning calorimetry at a heating rate of 10 degrees C./minute, wherein Tc (A) is a peak temperature of the crystallization of the crystalline polyarylketone resin (A) alone, Tc (A+B) is a peak temperature of crystallization of the film of the present invention, and Tg (B) is a glass transition temperature of a film of the noncrystalline polyetherimide resin (B) alone.

If Tc (A+B) is higher than [Tg (B)+20], that is, if a crystallization temperature of a film exceeds a glass transition temperature of a film of the noncrystalline polyetherimide resin (B) alone plus 20 degrees C., a greater decrease in edge tearing resistance may be caused by crystallization treatment, so that reliability of circuit and the handling property of the film may tend to be worsen, which is undesirable. It is believed without intention to limit the invention that molecules of the noncrystalline polyetherimide resin (B) move vigorously before the crystallization of the film is completed, which allows a crystalline structure such as spherulites originating from the crystalline portion of the polyarylketone resin (A) to highly develop, and then the interface between the spherulites acts as a defect to degrade the edge tearing resistance.

If Tc (A+B) equals Tc (A), that is, if the peak temperature of the crystallization of the present film equals the peak temperature of an amorphous film of the crystalline polyarylketone resin (A) alone, compatibility between the resin (A) and the resin (B) is bad, so that mechanical properties and appearance of the film tends to be bad. Therefore, the Tc (A+B) is preferably in a range of from [Tc (A)+5] degrees C. to [Tg (B)+15] degrees C., particularly from [Tc (A)+10] degrees C. to Tg (B).

By crystallizing the aforesaid film, its heat resistance can be improved. A degree of the crystallization can be monitored, for instance, by a value, (ΔHm−ΔHc)/ΔHm, determined by differential scanning calorimetry. In the present invention, the degree of crystallization is such that the value satisfies the following relation (II).

$$0.90 \leq [(\Delta Hm - \Delta Hc)/\Delta Hm] \tag{II}$$

wherein, ΔHm is a heat of crystal fusion in J/g and ΔHc is a heat of crystallization during the heating in J/g. The maximum of the value is 1.0. The greater the value, the greater the degree of crystallization. If the value is less than 0.90, dimension stability and/or heat resistance of the film may not be undesirably insufficient.

In the present invention, a heat of crystal fusion in J/g, ΔHm, and a heat of crystallization in J/g, ΔHc(J/g), are determined from a thermogram obtained by heating 10 mg of a sample from room temperature to 400 degrees C. at a heating rate of 10 degrees C./minute according to the Japanese Industrial Standards, JIS-K7122, using DSC-7, ex Perkin-Elmar Inc.

The aforesaid value, [(ΔHm−ΔHc)/ΔHm], depends more on molding and processing conditions of the film than a type and molecular weights of the raw material polymers, and contents in the composition. By cooling a film immediately after molding the molten raw polymers, a film having a smaller value can be obtained. Subjecting the film to crystallization treatment can increase the value.

Any method and a period of time can be employed for the crystallization treatment, such as a cast crystallization method where a film is crystallized when cast-extruded; an in-line crystallization method where crystallization is effected in a film molding line, e.g., on a heat treatment roll or in a hot wind furnace; and an out-line crystallization method where crystallization is effected off a film molding line, e.g., in a thermostatted oven or by a hot press.

In the present invention, the out-line crystallization method is preferably used in view of stability of production and uniformity of property. A time of the crystallization treatment may be long enough for the value in the relation (II) to be 0.9 or higher, and may be in a range of from a few seconds to a few tens hours, preferably from a few minutes to about 3 hours.

The present film after crystallization treatment has a coefficient of linear expansion of $30 \times 10^{-6}$/degrees C. or smaller and an edge tearing resistance of at least 45 N, preferably at least 56.3 N, in both longitudinal and transversal directions. The film is particularly suitable for a base material of an electronic board such as a flexible printed wiring board.

If the coefficient of linear expansion is larger than $30 \times 10^{-6}$/degrees C., a laminate of a film with a metal foil tends to curl or warp or to have insufficient dimension stability. A preferred range of the coefficient of linear expansion depends on a type of the metal foil used, a circuit pattern formed on the front and the back sides of the laminate, and the laminate structure, but is generally from $10 \times 10^{-6}$/degrees C. to $25 \times 10^{-6}$/degrees C. If the edge tearing resistance is smaller than 40 MPa, reliability of circuit connection is insufficient in a thin board such as a flexible printed wiring board, or a handling property during processing of the board tends to be bad. In the present invention, the edge tearing resistance is measured according to edge tearing resistance test specified in JIS C2151, where a test specimen of 15 mm width by 300 mm length was cut out from a 75 μm-thick film and tested at a drawing speed of 500 mm/min using a test fixture B.

The present composition may comprise other resin or various additives in addition to inorganic fillers, such as heat stabilizers, UV absorbers, photo-stabilizers, nucleating agents, colorants, lubricants, and flame retardants in such an amount that does not adversely affect the properties of the composition.

To mix additives, any known method can be used. For example, (a) a master batch is prepared by incorporating the additive at a high concentration, typically of from 10 to 60 wt %, in an appropriate base resin, the polyarylketone resin and/or the noncrystalline polyetherimide resin, and added to the resins to be used to attain a desired concentration of the additive and then mechanically blended with a kneader or an extruder, or (b) the additive is mechanically blended directly with the resins to be used in a kneader or an extruder. Among the aforesaid mixing methods, the method (a), preparing a master batch and blending, is preferred because higher dispersion and easier handling of the additives is attained. To improve handling property of the film, embossing or corona treatment may be applied to a surface of the film.

The present film may be formed by any known method such as an extrusion casting method using a T-die and a calendar method. Preferably, the extrusion casting method using a T-die is used, but not limited to it, because it allows one to make a film with ease and stable productivity. In the extrusion casting method using a T-die, a molding temperature is generally in a range of from about a melting temperature of the composition to about 430 degrees C., though it is adjusted depending on a flow property and film moldability of the composition. The film usually has a thickness of from about 10 to about 800 μm.

Another aspect of the present invention is a metal laminate comprising a metal body laminated on at least one side of the aforesaid film without an adhesive layer therebetween. The laminate can be obtained by heat bonding a metal body on one side of a film, for example, a film that satisfies the relation (I). During the heat bonding, pressure may be applied. Preferably, the film is used having the value, $[(\Delta Hm - \Delta Hc)/\Delta Hm]$, of 0.5 or lower. If the value is larger than 0.5, the lamination with the metal body needs to be performed at a higher temperature. In addition, multilayer lamination may be difficult. After laminating the metal on the film, the film may be subjected to the crystallization treatment to increase the value, $[(\Delta Hm - \Delta Hc)/\Delta Hm]$, to 0.9 or higher to thereby improve the heat resistance of the laminate.

Any known methods can be used to heat bonding a metal body on a film without an adhesive layer therebetween, for example, a method of pressing a film and a metal body in a press preheated to a desired heat bonding temperature, a method of preheating a metal body to a heat bonding temperature and pressing it onto a film, a continuous method of pressing a film and a metal body on a hot rolls preheated to a heat bonding temperature, and a combination thereof. When a press is used, it is preferred to employ a pressure per area of from 0.98 to 9.8 MPa, i.e., 10 to 100 kg/cm$^2$, under a reduced pressure of about 973 hPa so as to avoid oxidation of the metal. The lamination may be made on one sides of the film and the metal, or on both sides of the film and/or the metal.

Any known method such as etching may be used to form conductive circuits on the metal body of the present metal laminate for an electronic board such as a flexible printed wiring board, rigid-flexible board, built-up multilayer board, bundled multilayer board, and metallic base board. Methods to form interlayer connection in a multilayer board include plating through-holes with copper, filling a conductive paste or solder balls in through-holes or inner via holes, and utilizing an anisotropically conductive material comprising fine conductive particles in an insulating layer.

The metal body to be used in the present invention may comprise copper, silver, gold, iron, zinc, aluminum, magnesium, nickel, or alloys thereof. These may be used alone or in a mixture of two or more of them. Also, the metal may be surface treated with a surface treatment agent such as aminosilane, as far as the purpose of the present invention is not disturbed.

The metal body may be in a form of a structural element, a strip to form electric or electronic circuit, or a foil having a thickness of from about 3 μm to about 70 μm to form circuit thereon by etching. An aluminum plate or foil is preferred mostly for heat dissipation; stainless steal plate or foil is preferred for an application where high corrosion resistance, mechanical strength, or electric resistance is required; a copper foil is preferred for forming a complicated and fine circuit. Particularly one which is chemically treated, e.g., by black oxidation treatment is preferred. To increase bonding strength, a surface of the metal body to be bonded to a molded article of the mixed resin is preferably roughened chemically or mechanically before bonded. An example of such a roughened conductive film is a roughened copper foil which has been electrochemically treated in the production of electrolytic copper foils.

EXAMPLES

The present invention will be explained with reference to the following Examples, but not limited to them. Measurements and evaluation of the films described in the Examples were carried out as follows, wherein a longitudinal direction means a machine direction of an extruder and a transversal direction means a direction normal to the machine direction.

(1) Glass Transition Temperature (Tg), Peak Temperature of Crystallization (Tc), Melting Peak Temperature of Crystals (Tm)

These temperatures were determined from a thermogram obtained by heating 10 mg of a sample at a heating rate of 10 degrees C./minute according to the Japanese Industrial Standards, JIS-K7121, using DSC-7, ex Perkin-Elmer Inc.

(2) $(\Delta Hm - \Delta Hc)/\Delta Hm$

The value, $(\Delta Hm - \Delta Hc)/\Delta Hm$, was calculated from a heat of crystal fusion, $\Delta Hm(J/g)$, and a heat of crystallization, $\Delta Hc(J/g)$, which were determined from a thermogram obtained by heating 10 mg of a sample at a heating rate of 10 degrees C./minute according to JIS-K7122, using DSC-7, ex Perkin-Elmer Inc.

(3) Coefficient of Linear Expansion

Using thermomechanical analyzer (TMA), model SS6100, ex Seiko Instrument Corp., a test strip having a 10 mm length and a cross-sectional area of 1 mm$^2$ cut out from a film was fixed under a tensile load of $9.807 \times 10^{-4}$ N and heated from 30 degrees C. to 220 degrees C. at a heating rate of 5 degrees C./minute. A coefficients of thermal expansion in longitudinal direction, $\alpha 1$(long.), and transversal direction, $\alpha 1$(trans.), were determined by measuring expanded amounts versus temperature.

(4) Edge Tearing Resistance

According to the edge tearing resistance test specified in JIS C2151, a test specimen of 15 mm width by 300 mm length was cut out from a 75 μm-thick film and tested both in its longitudinal and transversal directions at a drawing speed of 500 mm/min using a test fixture B.

(5) Bonding Strength

The bonding strength was measured according to the method for measuring peeling strength of a film in its original state specified in JIS C6481.

(6) Soldering Heat Resistance

In accordance with JIS C6481 for the soldering heat resistance test of a film in its original state, a test specimen was floated on a solder bath at 260 degrees C. for 20 seconds in such a manner that a copper foil laminated on the film was in contact with the solder. After cooled to room temperature, the specimen was visually observed for the presence of blistering and/or peeling and evaluated.

Example 1

As shown in Table 1, a composition consisting of 70 parts by weight of a polyetheretherketone resin (PEEK381G, ex Victrex Co., having a Tg of 143 degrees C., Tc of 169 degrees C., and Tm of 334 degrees C., hereinafter referred to as PEEK), 30 parts by weight of a polyetherimide resin (Ultem-CRS5001, ex General Electric Co., having a Tg of 226 degrees C., hereinafter referred to as PEI-1), and 25 parts by weight of a commercially available mica(having an average particle size of 10 μm and an average aspect ratio of 50) was melt kneaded at 380 degrees C. in an extruder provided with a T-die, and molded into a film of 75 μm-thickness, which was rapidly cooled on cast rolls at 160 degrees C. The film obtained is hereinafter referred to as amorphous film. Then, the film obtained was subjected to crystallization treatment in a thermostatted oven at 230 degrees C. for 180 minutes. The crystallized film thus obtained is hereinafter referred to as crystallized film. The amorphous film and the crystallized film were analyzed for thermal properties and edge tearing resistance. The results are as seen in Table 1.

Example 2

The procedures of Example 1 were repeated except that the mixing ratio of PEEK to PEI-1 was changed to 40 parts by weight to 60 parts by weight as seen in Table 1. As in Example 1, an amorphous film and a crystallized film were obtained. The resistance and so on are as seen in Table 1.

Example 3

The procedures of Example 1 were repeated except that the mixing ratio of PEEK to PEI-1 was changed to 30 parts by weight to 70 parts by weight as seen in Table 1. As in Example 1, a noncrystalline film and a crystallized film were obtained. The results of the measurements of thermal properties, edge tearing resistance and so on are as seen in Table 1.

Comparative Example 1

The procedures of Example 1 were repeated except that a noncrystalline polyetherimide resin (Ultem 1000, ex General Electric Co., having a Tg of 216 degrees C., hereinafter simply referred to as PEI-2) was used instead of PEI-I as seen in Table 1. As in Example 1, an amorphous film and a crystallized film were obtained. The results of the measurements of thermal properties, edge tearing resistance and so on are as seen in Table 1.

Comparative Example 2

The procedures of Example 2 were repeated except that PEI-2 was used instead of PEI-1 as seen in Table 1. As in Example 1, an amorphous film and a crystallized film were obtained. The results of the measurements of thermal properties, edge tearing resistance and so on are as seen in Table 1.

Comparative Example 3

The procedures of Example 3 were repeated except that PEI-2 was used instead of PEI-1. As in Example 3, an amorphous film and a crystallized film were obtained. The results of the measurements of thermal properties, edge tearing resistance and so on are as seen in Table 1.

Example 4

A composition consisting of 40 parts by weight of PEEK, 60 parts by weight of PEI-1 and 30 parts by weight of mica used in Example 1 was extruded at 380 degrees C. into a 75 μm-thick film in an extruder provided with a T-die. Immediately after extruded, a copper foil of a thickness of 18 μm with a roughened surface was laminated on one side of the extruded film on a casting roll at 250 degrees C., whereby a copper foil laminate was obtained. A test piece having a size of A4 was cut out from the laminate. After forming a desired circuit on it by etching, through-holes were drilled, into which a conductive paste was filled. Then, two sheets of the laminates thus obtained with the conductive paste being filled in the through-holes were stacked on an aluminum plate of 1 mm thickness in he order of an aluminum plate/resin film/copper foil/resin film/copper foil, which were vacuum pressed at a pressure of 2.94 MPa at 240 degrees C. for 30 minutes into an aluminum based multilayered laminate. The aluminum based multilayered laminate thus obtained showed no warp, an adhesion strength of the copper foil of 1.6 N/mm and a good solder heat resistance.

INDUSTRIAL APPLICABILITY

The present film has an excellent edge tearing resistance. The film and the metal laminate thereof are suitable for electronic parts. dimension stability and the edge tearing resistance. The metal laminate of Example 5 obtained by heat bonding the film having the crystallization properties specified in the present invention was found to have excellent adhesion strength and solder heat resistance. On the other hand, the films of Comparative Examples 1 and 2 of which crystallization properties were outside the scope of the present invention showed poorer edge tearing resistance.

The invention claimed is:

1. A film of a resin composition comprising total 100 parts by weight of a crystalline polyarylketone resin (A) and a noncrystalline polyetherimide resin (B), and 5 to 50 parts by weight of a filler, said film having a peak temperature of crystallization, Tc (A+B), measured by differential scanning calorimetry at a heating rate of 10 degrees C./minute, which satisfies the following relation $$Tc(A) < Tc(A+B) \leq Tg(B) - 14.7$$

wherein, Tc (A) is a peak temperature of crystallization of the crystalline polyarylketone resin (A), Tc (A+B) is the peak temperature of crystallization of the film, and Tg (B) is a glass transition temperature of the noncrystalline polyetherimide resin (B), each temperature

TABLE 1

|  |  | Example | | | Comparative Example | | |
| --- | --- | --- | --- | --- | --- | --- | --- |
|  |  | 1 | 2 | 3 | 1 | 2 | 3 |
| PEEK, parts by weight | | 70 | 40 | 30 | 70 | 40 | 30 |
| PEI-1, parts by weight | | 30 | 60 | 70 | | | |
| PEI-2, parts by weight | | | | | 30 | 60 | 70 |
| Mica, parts by weight | | 25 | 25 | 25 | 25 | 25 | 25 |
| Crystallization Properties of the Amorphous Film | | | | | | | |
| Crystallization Temperature of Resin Composition | | | | | | | |
| Tc(A + B), ° C. | | 194.6 | 211.3 | 210.0 | 205.1 | 247.3 | 258.3 |
| Tg of PEI used | | | | | | | |
| Tg(B), ° C. | | 226 | 226 | 226 | 216 | 216 | 216 |
| Evaluation of the Crystallized Film | | | | | | | |
| Crystallization Temperature, ° C. | | 230 | 230 | 230 | 230 | 260 | 260 |
| Crystallization Time, minute | | 180 | 180 | 180 | 180 | 180 | 180 |
| (ΔHm − ΔHc)/ΔHm (−) | | 0.99 or greater | 0.99 or greater | 0.99 or greater | 0.99 or greater | 0.99 or greater | 0.99 or greater |
| Coefficient of Linear Expansion α1(longitudinal) | $10^{-6}$/° C. | 17 | 14 | 13 | 21 | 19 | 18 |
| Coefficient of Linear Expansion α1(transversal) | | 25 | 21 | 18 | 28 | 27 | 25 |
| Edge Tearing Resistance, N | longitudinal | 216.3 | 204.5 | 194.3 | 150.1 | 144.2 | 133.9 |
|  | transversal | 119.3 | 98.6 | 80.9 | 51.4 | 33.9 | 26.6 |

It can be seen from Table 1 that the films of Examples 1 to 3 having the crystallization properties specified in the present invention had well balanced properties between the dimension stability and the edge tearing resistance. The metal laminate of Example 4 obtained by heat bonding the film having the crystallization properties specified in the present invention was found to have excellent adhesion strength and solder heat resistance. On the other hand, the films of Comparative Examples 1 to 3 of which crystallization properties were outside the scope of the present invention showed poorer edge tearing resistance.

value being measured by differential scanning calorimetry at a heating rate of 10 degrees C./minute.

2. The film according to claim 1, wherein the crystalline polyarylketone resin (A) comprises a polyetheretherketone resin having structural repeating units of formula (1) and the noncrystalline polyetherimide resin (B) comprises a polyetherimide resin having structural repeating units of formula (2)

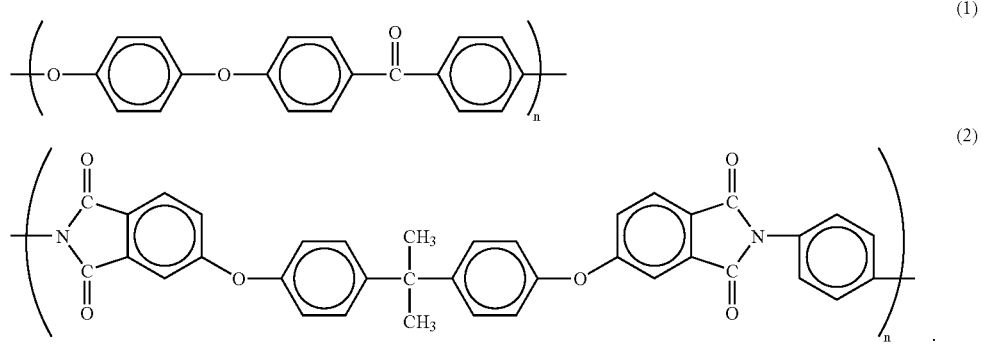

3. The film according to claim 1, wherein the filler is an inorganic filler in an amount of from 10 to 40 parts by weight per total 100 parts by weight of the crystalline polyarylketone resin (A) and the noncrystalline polyetherimide resin (B).

4. The film according to claim 2, wherein the melting peak temperature of crystals of a mixed resin consisting of the crystalline polyarylketone resin (A) and the noncrystalline polyetherimide resin (B) is 260 degrees C. or higher, and a mixing ratio of (A)/(B) is in a range of from 70/30 to 30/70.

5. A crystallized film from the film according to claim 1.

6. The film according to claim 5, wherein the crystallization is performed in an out—line crystallization method.

7. The film according to claim 5, wherein the film has a coefficient of linear expansion of 30 ×10$^{-6}$/degrees C. or smaller and an edge tearing resistance of at least 56.3 N in both longitudinal and transversal directions.

8. A metal laminate comprising a metal body laminated on at least one side of the film according to claim 1 without an adhesive layer therebetween.

9. The metal laminate according to claim 8, wherein the metal body comprises copper, aluminum, or stainless steel.

10. The metal laminate according to claim 8, wherein the metal body is laminated to the film by heat bonding.

11. A crystallized film comprising total 100 parts by weight of a crystalline polyaryilketone resin (A) and a noncrystalline polyetherimide resin (B), and 5 to 50 parts by weight of a filler, said film having a coefficient of linear expansion of 30 ×10$^{-6}$/degrees C. or smaller and an edge tearing resistance of at least 56.3 N in both longitudinal and transversal directions.

12. A metal laminate comprising a metal body laminated on the film according to claim 11.

13. The metal laminate according to claim 12, wherein the metal body comprises copper, aluminum, or stainless steel.

* * * * *